(12) United States Patent
Miyamoto

(10) Patent No.: US 7,205,766 B2
(45) Date of Patent: Apr. 17, 2007

(54) MAGNET SYSTEM AND MRI SYSTEM

(75) Inventor: Shoei Miyamoto, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 11/284,119

(22) Filed: Nov. 21, 2005

(65) Prior Publication Data

US 2006/0113997 A1 Jun. 1, 2006

(30) Foreign Application Priority Data

Nov. 30, 2004 (JP) ............... 2004-345567

(51) Int. Cl.
- *G01V 3/00* (2006.01)
- *H01F 3/00* (2006.01)
- *G01R 33/46* (2006.01)

(52) U.S. Cl. .............. 324/319; 324/320; 324/318; 335/297

(58) Field of Classification Search ............. None
See application file for complete search history.

(56) References Cited

U.S. PATENT DOCUMENTS

| | | | |
|---|---|---|---|
| 4,590,428 A * | 5/1986 | Muller et al. ............... 324/320 |
| 4,656,447 A | 4/1987 | Keim et al. |
| 4,673,882 A | 6/1987 | Buford |
| 4,682,111 A | 7/1987 | Hughes |
| 4,935,545 A | 6/1990 | Nordquist et al. |
| 5,061,897 A | 10/1991 | Danby et al. |
| 5,124,651 A * | 6/1992 | Danby et al. ............... 324/318 |
| 5,280,247 A | 1/1994 | DeMeester et al. |
| 5,804,968 A | 9/1998 | Richard et al. |
| 6,049,207 A | 4/2000 | Petropoulos |
| 6,078,177 A | 6/2000 | Petropoulos et al. |
| 6,100,692 A | 8/2000 | Petropoulos et al. |
| 6,150,818 A * | 11/2000 | Barber ....................... 324/319 |
| 6,236,203 B1 | 5/2001 | Shvartsman et al. |
| 6,259,252 B1 * | 7/2001 | Laskaris et al. ............ 324/319 |
| 6,326,785 B1 * | 12/2001 | Kruspe ....................... 324/303 |
| 6,429,761 B2 * | 8/2002 | Laskaris et al. ............ 335/299 |
| 6,552,639 B2 * | 4/2003 | Decristofaro et al. ....... 335/216 |
| 6,694,602 B2 * | 2/2004 | Laskaris et al. ........... 29/602.1 |
| 6,794,973 B1 * | 9/2004 | Aoki et al. ................. 335/299 |
| 6,838,966 B2 * | 1/2005 | Inoue ......................... 335/297 |
| 7,011,718 B2 * | 3/2006 | Decristofaro et al. ....... 148/121 |
| 2001/0005165 A1 * | 6/2001 | Laskaris et al. ............ 335/299 |
| 2001/0043134 A1 * | 11/2001 | Decristofaro et al. ....... 335/302 |

(Continued)

FOREIGN PATENT DOCUMENTS

JP 2000-157515 6/2000

*Primary Examiner*—Brij Shrivastav
*Assistant Examiner*—Tiffany A. Fetzner
(74) *Attorney, Agent, or Firm*—Carl B. Horton, Esq.; Armstrong Teasdale LLP

(57) ABSTRACT

The present invention is intended to provide a magnet apparatus obviating the necessity of shield coils designed to suppress eddy currents. The magnet apparatus has gradient coils disposed in a bore of a cylindrical superconducting magnet, and includes a cylindrical structure that is realized with a combination of tiles made of a high-permeability material and that is interposed between the internal surface of the superconducting magnet and the external surface of the gradient coils. The tiles made of a high-permeability material are laminates made of a high-permeability material. The high-permeability material is a silicon steel plate or an amorphous magnetic material.

12 Claims, 2 Drawing Sheets

U.S. PATENT DOCUMENTS

2002/0021129 A1* 2/2002 Laskaris et al. ............ 324/319
2003/0106619 A1* 6/2003 Decristofaro et al. ....... 148/304
2006/0096427 A1* 5/2006 Decristofaro et al. .......... 83/13
2006/0113997 A1* 6/2006 Miyamoto .................. 324/318

* cited by examiner (1) RF
(2) Slice
(3) Read
(4) Phase
(5) Signal — echo

MAGNET SYSTEM AND MRI SYSTEM

CROSS REFERENCE TO RELATED APPLICATIONS

This application claims the benefit of Japanese Application No. 2004-345567 filed Nov. 30, 2004.

BACKGROUND OF THE INVENTION

The present invention relates to a magnet apparatus and a magnetic resonance imaging (MRI) apparatus. More particularly, the present invention is concerned with a magnet apparatus having gradient coils disposed in a bore of a cylindrical superconducting magnet, and an MRI apparatus employing the magnet apparatus.

MRI apparatuses are designed to reconstruct images according to magnetic resonance signals acquired through a magnet apparatus. A superconducting magnet apparatus has gradient coils and radiofrequency (RF) coils disposed in a bore of a cylindrical superconducting magnet.

In order to suppress eddy currents induced in a metallic housing that is part of the superconducting magnet, shield coils are interposed between the internal surface of the metallic housing and the external surface of the gradient coils in order to produce magnetic fields whose directions are opposite to the directions of magnetic field gradients acting on the metallic housing (refer to, for example, Patent Document 1).

[Patent Document 1] Japanese Unexamined Patent Publication No. 2000-157515 (p. 4 and 5, FIGS. 1 and 2)

The inclusion of shield coils brings about as a side effect degradation of the efficiency in using power for production of magnetic field gradients. Therefore, a greater power is needed for production of desired magnetic field gradients than when the shield coils are not included. Moreover, heat dissipation increases, and vibrations and noises derived from production of magnetic field gradients grow in intensity.

SUMMARY OF THE INVENTION

Therefore, an object of the present invention is to provide a magnet apparatus obviating the necessity of shield coils designed to suppress eddy currents, and an MRI apparatus including the magnet apparatus.

In efforts to solve the aforesaid problems, according to one aspect of the present invention, there is provided a magnet apparatus having gradient coils disposed in a bore of a cylindrical superconducting magnet. Herein, the magnet apparatus includes a cylindrical structure that is realized with a combination of tiles made of a high-permeability material and that is interposed between the internal surface of the superconducting magnet and the external surface of the gradient coils.

In efforts to solve the aforesaid problems, according to another aspect of the present invention, there is provided an MRI apparatus for reconstructing images according to magnetic resonance signals acquired through a magnet apparatus that has gradient coils and RF coils disposed in a bore of a cylindrical superconducting magnet. Herein, the magnet apparatus includes a cylindrical structure that is realized with a combination of tiles made of a high-permeability material and that is interposed between the internal surface of the superconducting magnet and the external surface of the gradient coils.

Preferably, the tiles made of a high-permeability material are laminates made of a high-permeability material so that eddy currents can be effectively suppressed.

Preferably, the high-permeability material is a silicon steel plate because of the superb magnetic and electric characteristics of the silicon steel plate.

Preferably, the high-permeability material is an amorphous magnetic material because of the more superb magnetic and electric characteristics of the amorphous magnetic material.

According to the present invention, the magnet apparatus has gradient coils disposed in a bore of a cylindrical superconducting magnet, and includes a cylindrical structure that is realized with a combination of tiles made of a high-permeability material and that is interposed between the internal surface of the superconducting magnet and the external surface of the gradient coils. Consequently, a magnet apparatus obviating the necessity of shield coils that are designed to suppress eddy currents, and an MRI apparatus including the magnet apparatus can be realized.

Further objects and advantages of the present invention will be apparent from the following description of the preferred embodiments of the invention as illustrated in the accompanying drawings.

DETAILED DESCRIPTION OF THE INVENTION

Figure 1:
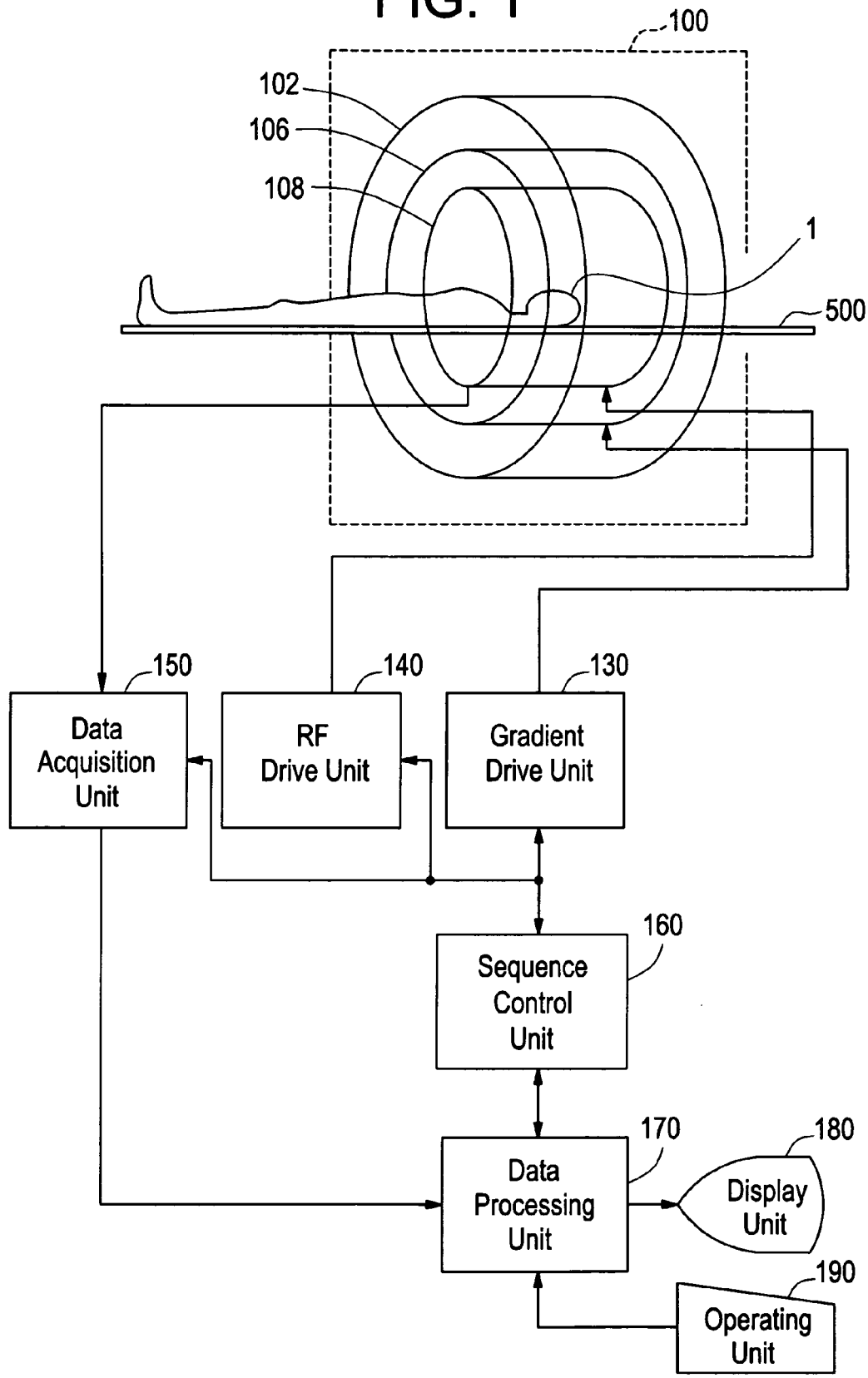
FIG. 1 is a block diagram of an MRI apparatus that is an example of the best mode for implementing the present invention.

Referring to drawings, the best mode for implementing the present invention will be described below. Noted is that the present invention shall not be limited to the best mode for implementing the present invention. FIG. 1 is a block diagram of an MRI apparatus. The MRI apparatus is an example of the best mode for implementing the present invention. The configuration of the MRI apparatus presents an example of the best mode for implementing the present invention in an MRI apparatus.

As illustrated, the MRI apparatus includes a magnet apparatus 100. The magnet apparatus 100 includes a main magnetic field coil unit 102, a gradient coil unit 106, and an RF coil unit 108. The coil units are generally cylindrical and mutually coaxial. The gradient coil unit 106 is an example of gradient coils included in the present invention. The RF coil unit 108 is an example of RF coils included in the present invention.

The magnet apparatus 100 is an example of the best mode for implementing the present invention. The configuration of the magnet apparatus 100 presents an example of the best mode for implementing the present invention in a magnet apparatus. The magnet apparatus 100 is an example of a magnet apparatus in accordance with the present invention. The magnet apparatus 100 will be described later.

A subject of imaging 1 is carried into a substantially cylindrical bore, that is, an internal space of the magnet apparatus 100 by a transporting means that is not shown cradled in a cradle 500.

The main magnetic field coil unit 102 generates a static magnetic field in the bore of the magnet apparatus 100. The direction of the static magnetic field is generally parallel to the direction of the body axis of the subject 1. A so-called horizontal magnetic field is generated. The main magnetic field coil 102 is realized with a superconducting coil.

The gradient coil unit 106 produces three magnetic field gradients that change the static magnetic field strength at respective gradients in the directions of three mutually perpendicular axes, that is, a slice axis, a phase axis, and a frequency axis.

Assuming that mutually perpendicular coordinate axes in a static magnetic field space are x, y, and z axes, any of the axes may be regarded as the slice axis. In this case, one of the two remaining axes is regarded as the phase axis, and the other is regarded as the frequency axis. Moreover, the slice axis, phase axis, and frequency axis may have any slopes with respect to the x, y, and z axes respectively while being perpendicular to one another. In the MRI apparatus, the direction of the body width of the subject 1 shall be the x direction, the direction of the body thickness thereof shall be the y direction, and the direction of the body axis thereof shall be the z direction.

A magnetic field gradient produced in the slice-axis direction may be called a slice magnetic field gradient. A magnetic field gradient produced in the phase-axis direction may be called a phase-encoding magnetic field gradient. A magnetic field gradient produced in the frequency-axis direction may be called a readout magnetic field gradient. The readout magnetic field gradient is synonymous with a frequency-encoding magnetic field gradient. For production of the magnetic field gradients, the gradient coil unit 106 includes three gradient coils that are not shown.

The RF coil unit 108 produces radiofrequency (RF) magnetic fields, which are used to excite spins in the body of the subject 1, in the static magnetic field space. Production of the RF magnetic fields may be described as transmission of RF exciting signals. Moreover, the RF exciting signal may be called an RF pulse.

Electromagnetic waves, that is, magnetic resonance signals induced by excited spins are received by the RF coil unit 108. The magnetic resonance signal is a sampling signal to be transformed into frequency-domain data, that is, data defined in a Fourier space.

When a magnetic resonance signal is detected with a static magnetic field strength changed in the phase-axis and frequency-axis directions, the magnetic resonance signal is recognized to be encoded along the two axes, and provided as a sampling signal to be transformed into data defined in a two-dimensional Fourier space. When the slice magnetic field gradient is also employed in order to detect a magnetic resonance signal encoded along three axes, the magnetic resonance signal is provided as a sampling signal to be transformed into data defined in a three-dimensional Fourier space. The magnetic field gradients determine the location of magnetic resonance signals that are sampled to be transformed into data items defined in the two-dimensional or three-dimensional Fourier space. The Fourier space may be referred to as a k-space.

A gradient drive unit 130 is connected to the gradient coil unit 106. The gradient drive unit 130 applies a driving signal to the gradient coil unit 106 and thus causes the gradient coil unit 106 to produce magnetic field gradients. The gradient drive unit 130 includes three drive circuits, which are not shown, in association with the three gradient coils included in the gradient coil unit 106.

An RF drive unit 140 is connected to the RF coil unit 108. The RF drive unit 140 applies a driving signal to the RF coil unit 108 and thus causes the RF coil unit 108 to transmit RF pulses with which spins in the body of the subject 1 are excited.

A data acquisition unit 150 is connected to the RF coil unit 108. The data acquisition unit 150 acquires signals, which are received by the RF coil unit 108, in the form of digital data items.

A sequence control unit 160 is connected to each of the gradient drive unit 130, RF drive unit 140, and data acquisition unit 150. The sequence control unit 160 controls the gradient drive unit 130, RF drive unit 140, and data acquisition unit 150 so as to achieve acquisition of magnetic resonance signals. Hereinafter, acquisition of magnetic resonance signals may be described as scanning.

The sequence control unit 160 is realized using, for example, a computer. The sequence control unit 160 includes a memory. Programs that give instructions to the sequence control unit 160 and various kinds of data are stored in the memory. The capabilities of the sequence control unit 160 are implemented when the computer runs the programs stored in the memory.

The output terminal of the data acquisition unit 150 is connected to the data processing unit 170. Data acquired by the data acquisition unit 150 is transferred to the data processing unit 170. The data processing unit 170 is realized using, for example, a computer. The data processing unit 170 includes a memory. Programs that give instructions to the data processing unit 170 and various kinds of data are stored in the memory.

The data processing unit 170 is connected to the sequence control unit 160. The data processing unit 170 outranks and supervises the sequence control unit 160. The capabilities of the MRI apparatus are implemented when the data processing unit 170 runs the programs stored in the memory.

The data processing unit 170 stores data, which is acquired by the data acquisition unit 150, in the memory. A data space is created in the memory. The data space corresponds to the k-space. The data processing unit 170 performs inverse Fourier transform on data defined in the k-space so as to reconstruct an image.

A display unit 180 and an operating unit 190 are connected to the data processing unit 170. The display unit 180 is realized with a graphic display or the like. The operating unit 190 is realized with a keyboard including a pointing device.

Reconstructed images and various pieces of information which are received from the data processing unit 170 are displayed on the display unit 180. The operating unit 190 is manipulated by a user and transfers various commands or various pieces of information to the data processing unit 170. The user can interactively operate the MRI apparatus using the display unit 180 and operating unit 190.

Figure 2:
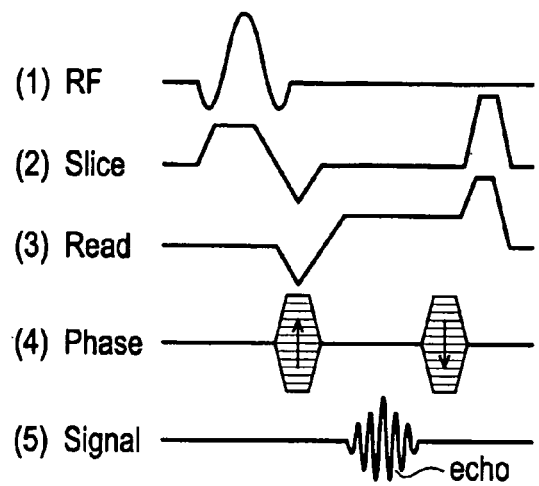
FIG. 2 shows a pulse sequence.

FIG. 2 shows an example of a pulse sequence for scanning. The pulse sequence is employed in implementation of a gradient echo imaging technique.

In FIG. 2, (1) shows the timing of applying an RF exciting pulse. (2) to (4) show the timings of applying a magnetic field gradient. (5) shows the timing of acquiring a magnetic resonance signal. Among the timings of applying respective magnetic field gradients, (2) is the timing of applying a slice magnetic field gradient, (3) is the timing of applying a frequency-encoding magnetic field gradient, and (4) is the timing of applying a phase-encoding magnetic field gradient. Incidentally, a static magnetic field is always applied with a constant magnetic field strength.

First, an α° pulse is applied in order to excite spins. Excitation using the α° pulse is selective excitation achieved by applying a slice magnetic field gradient Slice. After the excitation using the α° pulse is completed, a frequency-encoding magnetic field gradient Read and a phase-encoding magnetic field gradient Phase are applied at predetermined timings. Consequently, a magnetic resonance signal that is an echo is read out.

The above pulse sequence is repeatedly implemented a predetermined number of times with a repetition time TR between adjoining pulse sequences. Every time the pulse sequence is implemented, an echo is read out. Every time the pulse sequence is repeated, a direction in which phase encoding is performed in order to acquire the echo is modified. The repletion of the pulse sequence by the predetermined number of times completes acquisition of echoes needed to define data items in an entire two-dimensional k-space. When phase encoding is performed even in the slice-axis direction, echoes are acquired in order to define data items in a three-dimensional k-space. The echo data items defined in the two-dimensional k-space are subjected to two-dimensional Fourier transform, whereby a two-dimensional image is reconstructed. When the echo data items defined in the three-dimensional k-space are subjected to three-dimensional Fourier transform, a three-dimensional image is reconstructed.

Figure 3A:
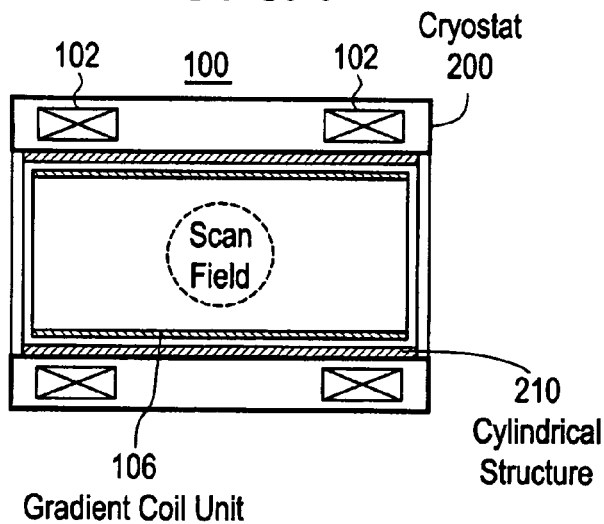
FIGS. 3A and 3B show a major portion of a magnet apparatus.
Figure 3B:
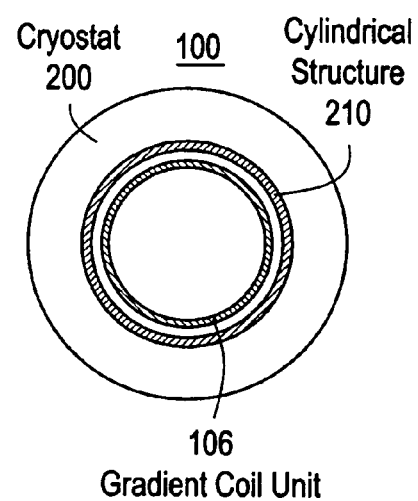

The magnet apparatus 100 will be described below. FIGS. 3A and 3B show the structure of a major portion of the magnet apparatus 100. In FIG. 3A is a longitudinal sectional view, and FIG. 3B is a cross-sectional view. As illustrated, the main magnetic field coil unit 102 is stored in a cryostat 200. The cryostat 200 is a metallic cylindrical body that is made of, for example, aluminum and that has a sealed bore formed between the external wall thereof and the internal wall thereof.

The main magnetic field coil unit 102 is stored in a hollow portion of the cryostat 200, and cooled down to a superconducting state by an appropriate cryogen, for example, liquid helium (He). The cryostat 200 accommodating the main magnetic field coil unit 102 may be called a superconducting magnet 200. The superconducting magnet 200 is an example of a superconducting magnet included in the present invention.

The gradient coil unit 106 is disposed in the bore of the cylindrical superconducting magnet 200. The RF coil unit 108 is disposed inside the gradient coil unit 106, though it is not shown. The center of the bore of the superconducting magnet 200, for example, a spherical field having a diameter of 300 mm, is regarded as a scan field.

A cylindrical structure 210 is interposed between the internal surface of the superconducting magnet 200 and the external surface of the gradient coil unit 106. The cylindrical structure 210 is an example of a cylindrical structure included in the present invention. The cylindrical structure 210 is realized with a combination of tiles made of a high-permeability material.

Figure 4:
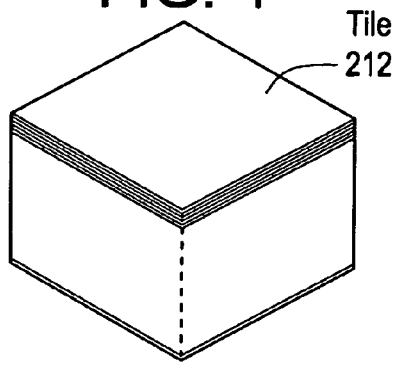
FIG. 4 shows a tile made of a high-permeability material.

The tile is, as shown in FIG. 4, shaped substantially like a rectangular parallelepiped. The dimensions of the tile are, for example, 50 mm, 50 mm, and 40 mm. The tile 212 is formed as a laminate made of a high-permeability material. A silicon steel plate is adopted as the high-permeability material. However, the high-permeability material is not limited to the silicon steel plate. For example, an iron-series amorphous magnetic material or any other proper high-permeability material may be used.

The cylindrical structure 210 is realized by closely laying the tiles 212 down over, for example, the internal surface of the superconducting magnet 200 and bonding the tiles. The cylindrical structure 210 may be formed according to any other method.

The cylindrical structure 210 acts as a shield that shields the metallic housing of the superconducting magnet, that is, the cryostat 200 from magnetic field gradients owing to the high permeability. Consequently, induction of eddy currents by the magnetic field gradients is suppressed.

Moreover, the high-permeability material such as the silicon steel plate or amorphous magnetic material causes few eddy currents because of the magnetic and electric characteristics. Moreover, the adoption of the tiles hinders flow of the eddy currents. Consequently, the cylindrical structure 210 induces very few eddy currents by itself.

Therefore, eddy currents can be suppressed without use of shield coils. Since the shield coils are not used, magnetic field gradients can be produced through efficient use of power. Eventually, heat dissipation and generation of vibrations or noises by the gradient coil unit 106 can be minimized.

Many widely different embodiments of the invention may be configured without departing from the spirit and the scope of the present invention. It should be understood that the present invention is not limited to the specific embodiments described in the specification, except as defined in the appended claims.

The invention claimed is:

1. A magnet apparatus that can be incorporated into a Magnetic Resonance Imaging (MRI) apparatus, the magnet apparatus having gradient coils disposed in a bore of a cylindrical superconducting magnet, comprising:
    a cylindrical structure that is realized with a combination of tiles made of a high-permeability material and that is interposed between the internal surface of the superconducting magnet and the external surface of the gradient coils, wherein said cylindrical structure, composed of said combination of tiles, is configured to surround and enclose the gradient coils and an imaging subject provided in said bore and to suppress eddy currents such that the subject may be imaged without the use of a shield coil.

2. The magnet apparatus according to claim 1, wherein the tiles made of a high-permeability material are laminates made of a high-permeability material.

3. The magnet apparatus according to claim 1, wherein the high-permeability material is a silicon steel plate.

4. The magnet apparatus according to claim 1, wherein the high-permeability material is an amorphous magnetic material.

5. An MRI apparatus configured for reconstructing images according to magnetic resonance signals acquired through a magnet apparatus that has gradient coils and RF coils disposed in a bore of a cylindrical superconducting magnet, wherein:
    the magnet apparatus includes a cylindrical structure that is realized with a combination of tiles made of a high-permeability material and that is interposed between the internal surface of the superconducting magnet and the external surface of the gradient coils, wherein said cylindrical structure, composed of said combination of tiles, is configured to surround and enclose the gradient coils and an imaging subject provided in said bore and to suppress eddy currents such that the subject may be imaged without the use of a shield coil.

6. The MRI apparatus according to claim 5, wherein the tiles made of a high-permeability material are laminates made of a high-permeability material.

7. The MRI apparatus according to claim 5, wherein the high-permeability material is a silicon steel plate.

8. The MRI apparatus according to claim 5, wherein the high-permeability material is an amorphous magnetic material.

9. A magnet apparatus that can be incorporated into a Magnetic Resonance Imaging (MRI) apparatus, the magnet apparatus having gradient coils disposed in a first bore of a cylindrical superconducting magnet, comprising:

a cylindrical structure that is realized with a combination of tiles made of a high-permeability material and that is interposed between the internal surface of the superconducting magnet and the external surface of the gradient coils, said tiles being disposed in a cylindrical tile structure defining a second bore therein, said gradient coils being disposed in said second bore, wherein said cylindrical structure, composed of said combination of tiles, is configured to surround and enclose an imaging subject provided in said second bore as well, as the gradient coils, and to suppress eddy currents such that the subject may be imaged without the use of a shield coil.

10. The magnet apparatus according to claim 9, wherein the tiles made of a high-permeability material are laminates made of a high-permeability material.

11. The magnet apparatus apparatus according to claim 9, wherein the high-permeability material is a silicon steel plate.

12. The magnet apparatus according to claim 9, wherein the high-permeability material is an amorphous magnetic material.

* * * * *

UNITED STATES PATENT AND TRADEMARK OFFICE
CERTIFICATE OF CORRECTION

PATENT NO. : 7,205,766 B2  
APPLICATION NO. : 11/284119  
DATED : April 17, 2007  
INVENTOR(S) : Miyamoto It is certified that error appears in the above-identified patent and that said Letters Patent is hereby corrected as shown below:

In Claim 11, column 8, line 11, delete "magnet apparatus apparatus according" and insert therefor -- magnet apparatus according --.

Signed and Sealed this

Sixth Day of November, 2007

JON W. DUDAS  
*Director of the United States Patent and Trademark Office*